United States Patent
Fjelstad et al.

(10) Patent No.: US 6,891,272 B1
(45) Date of Patent: May 10, 2005

(54) MULTI-PATH VIA INTERCONNECTION STRUCTURES AND METHODS FOR MANUFACTURING THE SAME

(75) Inventors: Joseph C. Fjelstad, Maple Valley, CA (US); Belgacem Haba, Cupertino, CA (US)

(73) Assignee: Silicon Pipe, Inc., San Jose, CA (US)

( * ) Notice: Subject to any disclaimer, the term of this patent is extended or adjusted under 35 U.S.C. 154(b) by 0 days.

(21) Appl. No.: 10/632,730

(22) Filed: Jul. 31, 2003

Related U.S. Application Data

(60) Provisional application No. 60/400,298, filed on Jul. 31, 2002.

(51) Int. Cl.[7] .............................................. H01L 23/48
(52) U.S. Cl. ...................... 257/774; 257/736; 257/750; 257/752; 257/758; 257/773; 257/786
(58) Field of Search ................................. 257/669, 670, 257/673, 674, 676, 688, 689, 728, 692–697, 735–739, 752, 758, 773–776, 780–786

(56) References Cited

U.S. PATENT DOCUMENTS

| | | |
|---|---|---|
| 3,795,845 A | 3/1974 | Cass et al. |
| 4,095,866 A | 6/1978 | Merrill |
| 4,202,007 A | 5/1980 | Dougherty et al. |
| 4,302,501 A | 11/1981 | Nagashima |
| 4,445,735 A | 5/1984 | Bonnefoy |
| 4,458,297 A | 7/1984 | Stopper et al. |
| 4,543,715 A * | 10/1985 | Iadarola et al. ............... 29/852 |
| 4,551,673 A | 11/1985 | Barth et al. |
| 4,636,919 A | 1/1987 | Itakura et al. |
| 4,675,243 A | 6/1987 | Obinata et al. |
| 4,730,159 A | 3/1988 | Collins |
| 4,731,643 A | 3/1988 | Dunham et al. |
| 4,748,495 A | 5/1988 | Kucharek |
| 4,768,154 A | 8/1988 | Sliwkowski et al. |

(Continued)

OTHER PUBLICATIONS

PCT International Search Report, dated Nov. 3, 2003, 8 pages.

*Primary Examiner*—Andy Huynh
(74) *Attorney, Agent, or Firm*—Shemwell Gregory & Courtney LLP

(57) ABSTRACT

A multilayered circuit component includes one or more substrates. A first surface of one of the substrates includes circuit paths and other current carrying elements. A second surface of the same or another substrate also includes circuit paths and other current carrying elements. An aperture extends through at least a portion of the one or more substrates. The aperture is defined by a first opening on the first surface, a second opening on the second surface, and an internal surface of the one or more substrates that extends between the first surface and the second surface. A first trace element is provided over a portion of the internal surface of the aperture to extend between the first surface and the second surface. The first trace element extends onto the first surface to form a first partial perimeter of the first opening. A second trace element is provided over a portion of the internal surface of the aperture to extend between the first surface and the second surface. The second trace element extends onto the first surface to form a second partial perimeter of the first opening.

20 Claims, 8 Drawing Sheets

U.S. PATENT DOCUMENTS

| | | | |
|---|---|---|---|
| 4,799,128 A | * 1/1989 | Chen | 361/795 |
| 4,799,617 A | 1/1989 | Friedman | |
| 4,812,792 A | 3/1989 | Leibowitz | |
| 4,814,945 A | 3/1989 | Leibowitz | |
| 4,838,800 A | 6/1989 | Lynch | |
| 4,861,251 A | 8/1989 | Moitzger | |
| 4,881,905 A | 11/1989 | Demler, Jr. et al. | |
| 4,912,603 A | 3/1990 | Seyama | |
| 4,935,584 A | 6/1990 | Boggs | |
| 4,956,749 A | 9/1990 | Chang | |
| 4,960,386 A | 10/1990 | Stanevich | |
| 4,969,826 A | 11/1990 | Grabbe | |
| 4,982,311 A | 1/1991 | Dehaine et al. | |
| 4,991,115 A | 2/1991 | Guthrie et al. | |
| 4,994,938 A | 2/1991 | Baudouin | |
| 5,009,611 A | 4/1991 | Regnier | |
| 5,012,924 A | 5/1991 | Murphy | |
| 5,019,946 A | 5/1991 | Eichelberger et al. | |
| 5,136,123 A | 8/1992 | Kobayashi et al. | |
| 5,155,577 A | 10/1992 | Chance et al. | |
| 5,162,792 A | 11/1992 | Morris | |
| 5,165,984 A | 11/1992 | Schoenthaler | |
| 5,185,502 A | 2/1993 | Shepherd et al. | |
| 5,220,490 A | 6/1993 | Weigler et al. | |
| 5,222,014 A | 6/1993 | Lin | |
| 5,227,013 A | 7/1993 | Kumar | |
| 5,291,375 A | 3/1994 | Mukai | |
| 5,309,324 A | 5/1994 | Herandez et al. | |
| 5,319,224 A | 6/1994 | Sakashita et al. | |
| 5,381,306 A | * 1/1995 | Schumacher et al. | 361/792 |
| 5,417,577 A | 5/1995 | Holliday et al. | |
| 5,424,492 A | 6/1995 | Petty et al. | |
| 5,441,917 A | 8/1995 | Rostoker et al. | |
| 5,490,040 A | 2/1996 | Gaudenzi et al. | |
| 5,491,364 A | 2/1996 | Brandenburg et al. | |
| 5,498,767 A | 3/1996 | Huddleston et al. | |
| 5,500,862 A | 3/1996 | Kawamura | |
| 5,544,018 A | 8/1996 | Sommerfeldt et al. | |
| 5,545,301 A | 8/1996 | Friese et al. | |
| 5,578,870 A | 11/1996 | Farnsworth et al. | |
| 5,584,721 A | 12/1996 | Taniuchi et al. | |
| 5,587,944 A | 12/1996 | Shen et al. | |
| 5,596,205 A | 1/1997 | Reedy et al. | |
| 5,623,160 A | * 4/1997 | Liberkowski | 257/621 |
| 5,634,093 A | 5/1997 | Ashida et al. | |
| 5,635,424 A | 6/1997 | Rostoker et al. | |
| 5,644,500 A | 7/1997 | Miura et al. | |
| 5,684,332 A | 11/1997 | Chen et al. | |
| 5,686,699 A | 11/1997 | Chu et al. | |
| 5,691,569 A | 11/1997 | Palmer | |
| 5,706,178 A | 1/1998 | Barrow | |
| 5,715,274 A | 2/1998 | Rostoker et al. | |
| 5,729,432 A | 3/1998 | Shim et al. | |
| 5,730,606 A | 3/1998 | Sinclair | |
| 5,745,374 A | 4/1998 | Matsumoto | |
| 5,774,340 A | 6/1998 | Chang et al. | |
| 5,781,446 A | 7/1998 | Wu | |
| 5,784,262 A | 7/1998 | Sherman | |
| 5,784,264 A | 7/1998 | Tanioka | |
| 5,786,631 A | 7/1998 | Fishley et al. | |
| 5,790,383 A | 8/1998 | Inagawa | |
| 5,819,403 A | 10/1998 | Crane, Jr. et al. | |
| 5,822,214 A | 10/1998 | Rostoker et al. | |
| 5,977,640 A | 11/1999 | Bertin et al. | |
| 6,087,732 A | 7/2000 | Chittipeddi et al. | |
| 6,121,679 A | 9/2000 | Luvara et al. | |
| 6,137,064 A | * 10/2000 | Kiani et al. | 174/266 |
| 6,150,729 A | 11/2000 | Ghahghahi | |
| 6,264,476 B1 | 7/2001 | Li et al. | |
| 6,285,560 B1 | 9/2001 | Lyne | |
| 6,304,450 B1 | 10/2001 | Dibene, II et al. | |
| 6,310,303 B1 | 10/2001 | Luvara et al. | |
| 6,310,398 B1 | 10/2001 | Katz | |
| 6,388,208 B1 | * 5/2002 | Kiani et al. | 174/266 |
| 6,507,496 B2 | 1/2003 | Levy et al. | |
| 6,547,570 B2 | 4/2003 | Eskildsen et al. | |
| 6,559,531 B1 | 5/2003 | Sutherland | |
| 6,594,811 B2 | 7/2003 | Katz | |
| 6,686,666 B2 | 2/2004 | Bodas | |
| 6,704,204 B1 | 3/2004 | Eskildsen et al. | |

* cited by examiner

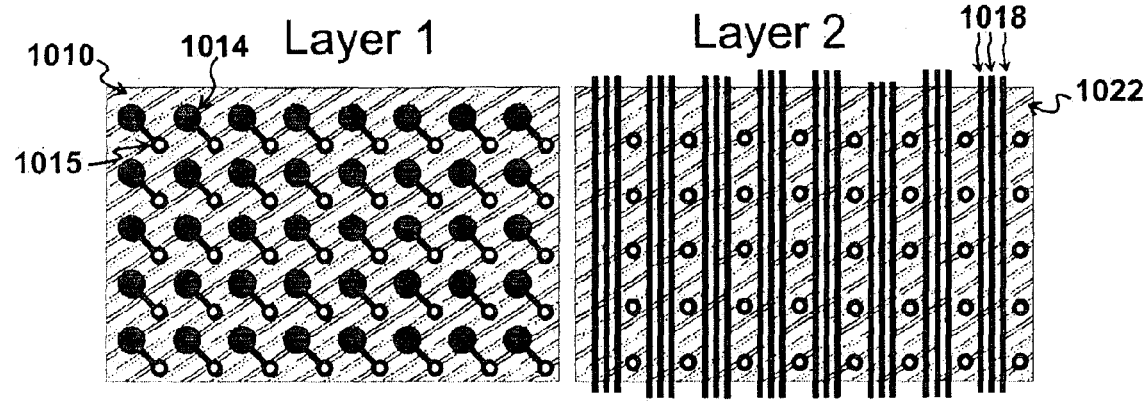
FIG. 11
(Prior Art)
FIG. 12
(Prior Art)
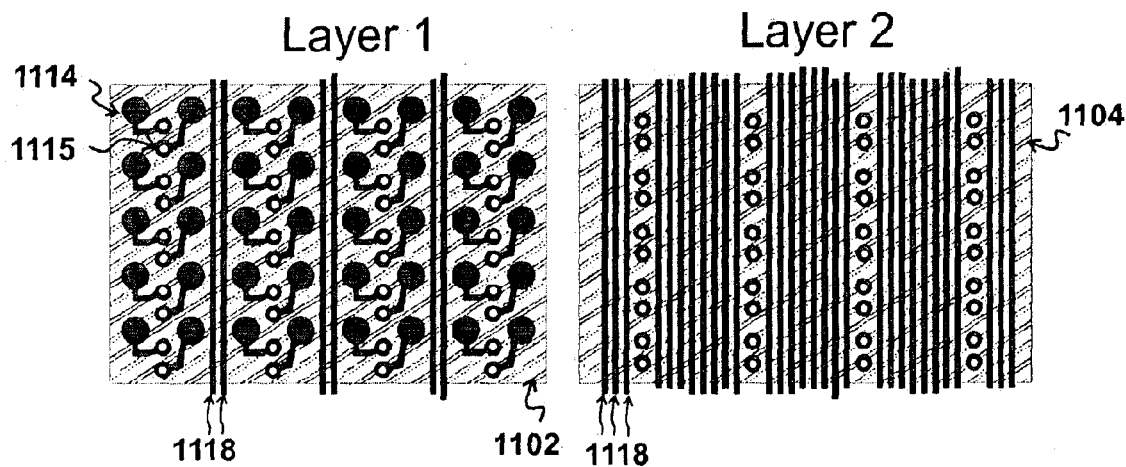
FIG. 13
FIG. 14

MULTI-PATH VIA INTERCONNECTION STRUCTURES AND METHODS FOR MANUFACTURING THE SAME

This application claims benefit of 60/400,298 Jul. 31, 2002.

TECHNICAL FIELD

The disclosed embodiments relate generally to the field of multilayered circuits. More particularly, the disclosed embodiments relate to a multilayered circuit structure with conductive interconnections between layers that form the structure.

BACKGROUND

In the field of electronics, the interconnections between layers of a multilayer circuit are critical to the creation of high-density interconnection structures. These interconnection structures are used both for integrated circuit (IC) packaging and for the interconnection substrates to which IC packages are mounted. The interconnections within these structures are most commonly created by means of plated through-hole vias. High-density substrates are increasingly required for present and future generations of electronic products. Consequently, numerous methods have been described, developed and employed to facilitate the creation of the plated vias necessary for high-density substrates.

Typically, the metal plated vias are made as small as possible to conserve space for circuit routing. Often, the vias are made in "blind" fashion, where the via only extends partially through some but not all of the layers in the overall structure. Such methods can make uniform plating of all vias difficult. This is due to concerns over solution flow into the cavities and the potential for air entrapment, which can result in open circuit or unreliable interconnections.

Other previous attempts for making high-density vias and other interconnections have included: (1) use of conductive posts or metal or metal polymer composites which are designed to pierce the insulation material between layers during lamination to make interconnection from one layer to another, and (2) holes in insulation material filled with metal pastes that are designed to make connection between adjacent layer conductor elements.

BRIEF DESCRIPTION OF THE DRAWINGS

FIG. 11 illustrates a front side of a substrate with traditional placement of vias and input/output contacts, under the prior art.

FIG. 12 illustrates a back side of a substrate with traditional placement of vias input/output contacts, and escape lines under the prior art.

FIG. 13 illustrates a front side of a substrate with vias, input/output contacts, and escape lines, under an embodiment of the invention.

FIG. 14 illustrates a back side of a substrate with vias input/output contacts, and escape lines, under an embodiment of the invention.

Figure 1:
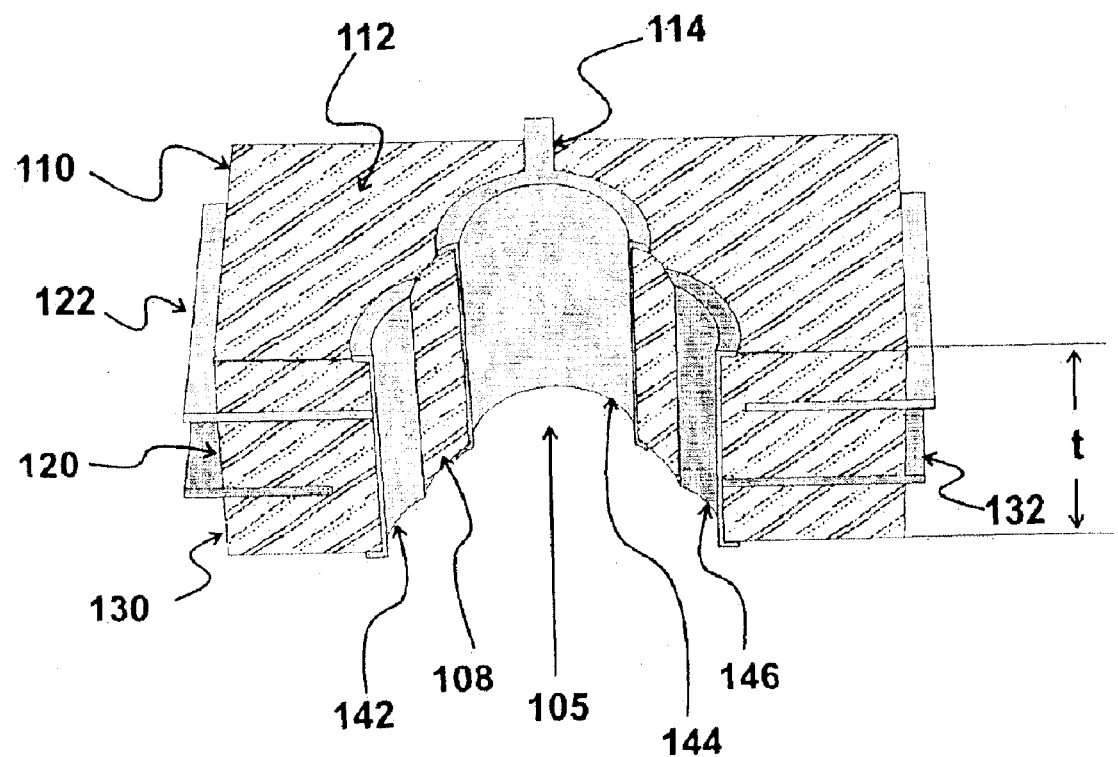
FIG. 1 is an isometric cross-sectional view of a multi-layered circuit structure, according to one embodiment of the invention.

In the drawings, the same reference numbers identify identical or substantially similar elements or acts. To easily identify the discussion of any particular element or act, the most significant digit or digits in a reference number refer to the Figure number in which that element is first introduced (e.g., element 130 is first introduced and discussed with respect to FIG. 1). Any modifications necessary to the Figures can be readily made by one skilled in the relevant art based on the detailed description provided herein.

DETAILED DESCRIPTION

Overview

All substrate circuit designs require and consist of three basic elements; power connections to supply voltage, ground connections to provide a return path and signal traces for connecting electronic component elements and transmitting signals. Because of the constraints of present design and manufacturing methods, circuit paths must often be routed in a less than optimum fashion. For example, circuit paths may be made circuitous, or otherwise longer than necessary, in order to accommodate spacing considerations of other elements on the substrate. With the transition to area array interconnections technology, the problem has become even more difficult. Embodiments of the invention provide structures and methods that obviate most of the challenges of substrate circuit design related to circuit routing. In particular, embodiments of the invention optimize or otherwise improve circuit routing by enhancing area array package interconnection.

According to an embodiment, a multi-layered circuit component may include one or more vias that interconnect current carrying components on different surfaces of the component. The vias may include rounded trace elements that are only partially circumferential with respect to an interior surface of the vias. Furthermore, the vias may be formed of irregular shaped non-circular openings.

In an embodiment, a method is provided for forming a substrate with vias containing multiple, partially circumferential trace elements. In one embodiment, a set of holes are formed into the substrate. The set of holes are plated with trace elements, so that the trace elements are circumferential within each of the holes. Then a larger hole is formed to substantially intersect, but not completely, the smaller holes. The larger hole removes most, but not all, of the peripheral portions of the smaller holes. The result is that the larger hole has a set of discrete, rounded trace elements on its border.

In one embodiment, a multilayered circuit component includes one or more substrates. A first surface of one of the substrates or layers includes circuit paths and other current carrying elements. A second surface of the same or another layer of the substrate also includes circuit paths and other current carrying elements. An aperture extends through at least a portion of the one or more substrate layers. The aperture is defined by a first opening on the first surface, a second opening on the second surface, and an internal surface of the one or more substrates that extends between the first surface and the second surface. A first trace element is provided over a portion of the internal surface of the aperture to extend between the first surface and the second surface. The first trace element extends onto the first surface to form a first partial perimeter of the first opening. A second trace element is provided over a portion of the internal surface of the aperture to extend between the first surface and the second surface. The second trace element extends onto the first surface to form a second partial perimeter of the first opening.

The term "via" refers to an opening or aperture in a structure that contains conductive elements and electrically interconnects two or more current-carrying surfaces of the structure. An example of a via includes a plated through-hole in a substrate, a partially plated through-hole in a substrate, and a micro-via, which is a plated recess.

Multi-Layered Circuit Structure

FIG. 1 is an isometric cross-sectional view of a multi-layered circuit structure, according to one embodiment of the invention. The structure includes a first substrate 110, a second substrate 120 and a third substrate 130, although more or fewer substrates may be employed. For purpose of explanation, each substrate is assumed to be one-sided, so that each substrate has one current-carrying surface. It is possible for the substrates to be co-laminated during a manufacturing process, so that they appear as one overall substrate. The first substrate 110 carries a signal plane 112 with a signal line 114. While signals are shown on an outer layer for convenience, the signal can be placed on either internal or external layers and make connections between any combination. The second substrate or layer 120 is internal and carries a power plane 122, and the third substrate or layer part of the multilayer carries a ground plane 132 and signals on a hidden side if needed. The signal plane 112, the power plane 122 and the ground plane 132 share a common via 105 that extends through the first, second, and third substrates. The via 105 is formed by drilling through the multilayered structure. The via 105 includes an inner surface 108 that extends within the thickness t of the structure.

In one embodiment, via 105 includes one or more conductive layers that extend on or over portions of the inner surface 108. In an embodiment such as shown by FIG. 1, via 105 includes a first trace element 142, a second trace element 144, and a third trace element 146. Each of the trace elements 142, 144 and 146 are distinct from the other trace elements. The formation of multiple trace elements in one via may be referred to as a "split via".

In an embodiment, each of the first, second and third trace elements 142, 144 and 146 are rounded and form only a portion of the overall cross-sectional perimeter of the via 105. Thus, in contrast to traditional plated vias which are cylindrical, the trace elements 142, 144, and 146 are only portions of a cylinder. When looked at from a cross-sectional view, each trace element is a curve, that if continued would form a perimeter shape, such as a circle or ellipse. Because each trace element extends only a portion of the arc-length of its circle, it is said to be partially circumferential.

Because embodiments described herein provide for trace elements that are not not completely circumferential, several benefits are attainable. Specifically, when the trace elements 142, 144, and 146 are energized, the shape of each trace element results in the via having less capacitance and inductance when compared to more traditional vias that are fully circular or circumferential about the vias and cylindrical in shape. Furthermore, the partial circumferential shape of each trace element 142, 144, and 146 reduces the magnetic field that would otherwise reside within the via 105. The reduction of capacitance, inductance and magnetic field is proportional to reduction of signal interference within the via 105, particularly in the case of high-density circuit applications.

Figure 2:
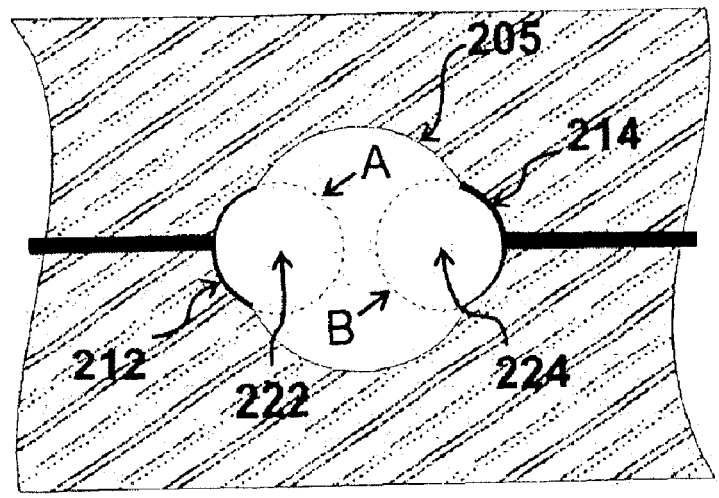
FIG. 2 is a cross-sectional view of a via, according to one embodiment of the invention.

FIG. 2 is a cross-sectional view of a via, according to one embodiment of the invention. The via 205 may be non-circular in shape, and contain trace elements 212 and 214 that extend with the via to opposing surfaces that contain circuitry and other current-carrying components. The trace element 212 has an arc that if continued would define a circle A (shown in phantom) having radius 222. Likewise, trade element 214 has an arc that if continued would define another circle B (shown in phantom) having a radius 224. As shown, each of the trace elements 212, 214 only form a portion of the overall perimeter or arc-length of their respective circles. Thus, the trace elements 212, 214 are partially circumferential. In one embodiment, trace elements 212, 214 form only a fraction of the overall perimeter of the respective circle A, B. More specifically, trace elements 212, 214 form less than 50% of the overall circumference of respective circles A, B. In one embodiment, trace elements 212, 214 form between 20–33% of the overall circumference of respective circles A, B, although even less circumferential trace elements are contemplated.

While embodiments such as shown by FIG. 2 contemplate use of relatively circular arcs as trace elements 212, 214, other embodiments may employ elliptical or otherwise curved trace elements. The trace elements may also be bent and semi-linear.

Figure 3:
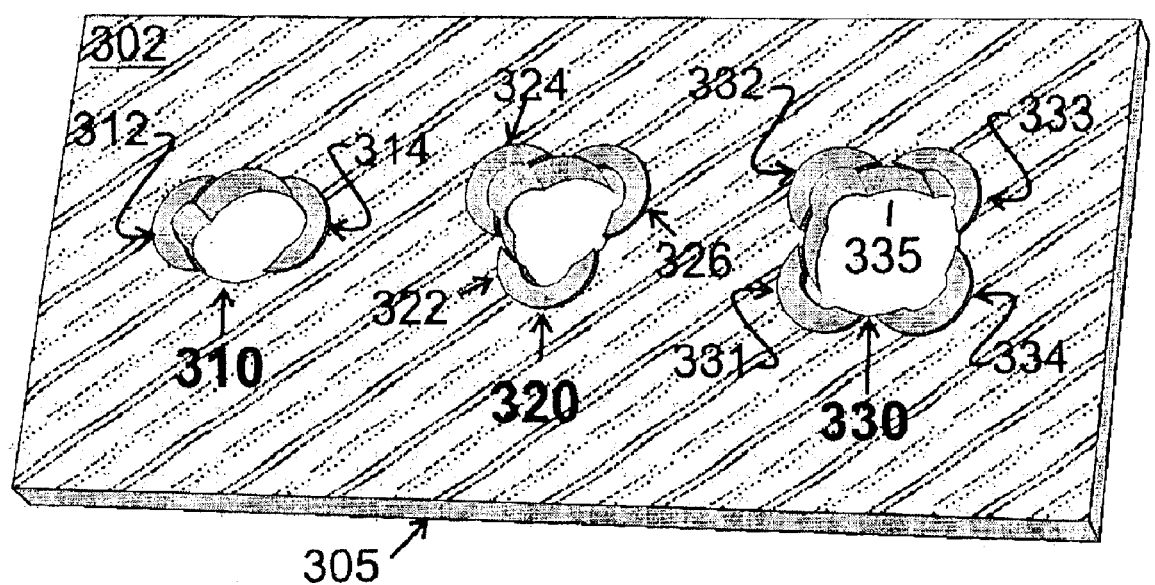
FIG. 3 is a top isometric view of a series of interconnecting vias that are exposed on a surface of a substrate where circuitry is provided.

FIG. 3 is a top isometric view of a series of interconnecting vias 310, 320, and 330 exposed on a 302 of a substrate 305 in which circuitry is provided. The construction of via 330 is assumed to be representative of the other vias, and is thus described in more detail. The via 330 is formed from an opening 335 that is provided with a plurality of distinct trace elements 331, 332, 333 and 334. The trace elements 331, 332, 333 and 334 are formed according to the illustration on the circuit baring surface 302 to abut the opening 335 and extend longitudinally into the opening 335. In an embodiment such as shown by FIG. 3, the trace elements 331, 332, 333 and 334 may be said to form "pedals" on the current-carrying surface 302. The pedals may correspond to deposits of tracing materials that are thicker and more irregular shaped than the signal lines on the substrate. The pedals may form points of connection on the substrate with a particular via. In general, pedals can be of a thickness, and have a geometric shape, such as semicircular, elliptical, or oblong. Each trace element 331, 332, 323 and 334 may connect to a power element, ground element, or signal element on the other side of substrate 305, or on another internal layer or external substrate altogether.

The opening 335, which matches the cross-section of the via 330 through the substrate 305, is irregular or at least non-circular. In one embodiment, the opening 325 has two or more radius of curvatures. The number of radius of curvatures may be dependent on the number of trace elements that opening is to carry. For example, the via 310 includes two trace elements 312, 314, which may be used, for example, to form a differential signal pair. The via 320 includes three trace elements 322, 324, 326, which may be used to interconnect a signal line, a ground plane and a power plane. The formation of the opening 335, as well as the shape of the trace elements 331, 332, 323 and 334 within the respective vias enables the trace elements to be brought closer together than more traditional designs where each via carries only one trace element.

Method for Forming Split Via

FIGS. 4A–4F illustrate a method for forming a substrate with a split via, according to an embodiment of the invention. The specific materials used for performing the method are conventional, and may be substituted for other materials know in the art.

Figure 4A:
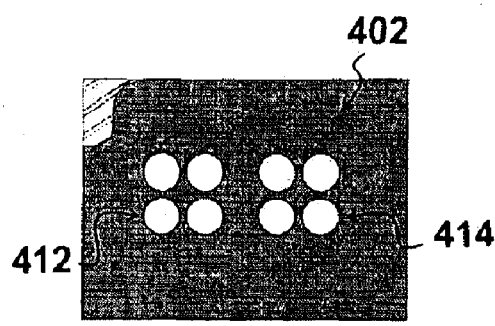
FIGS. 4A–4F illustrate a method for forming a substrate with a split via, according to an embodiment of the invention.

In FIG. 4A two or more clusters of holes 412, 414 are drilled into a copper clad laminate substrate 402. In the example provided, each cluster 412, 414 has four holes.

Figure 4B:
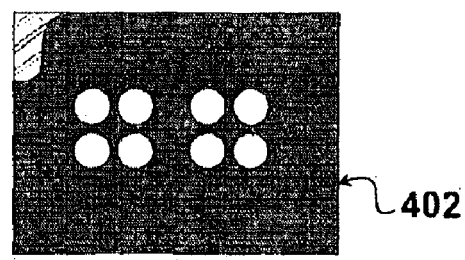

In FIG. 4B, the holes in each cluster 402, 404 are plated with copper.

Figure 4C:
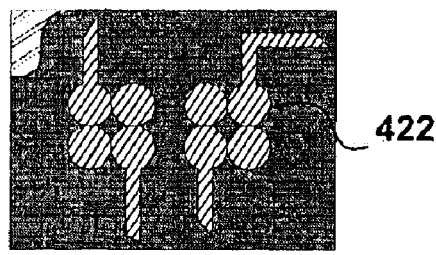

In FIG. 4C, circuit patterns 422 are imaged on the panel substrate 402.

Figure 4D:
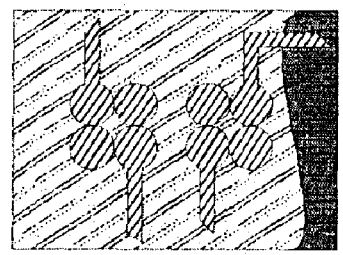

In FIG. 4D, exposed copper is etched away from the surface of the substrate 402.

Figure 4E:
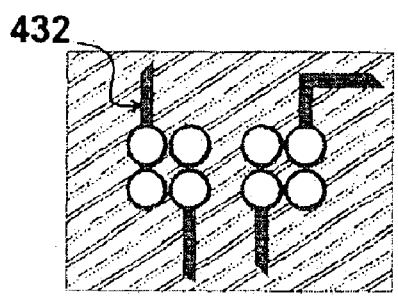

FIG. 4E illustrates copper circuits 432 that are exposed as a result of an etch resist process being performed.

Figure 4G:
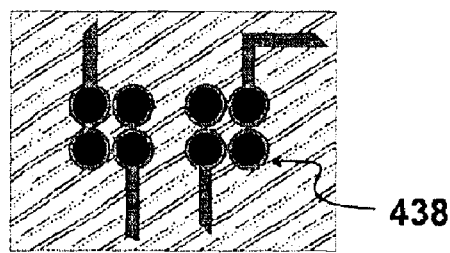
FIG. 4G illustrates an optional step that may be performed with a method such as described by FIGS. 4A–4F.
Figure 4F:
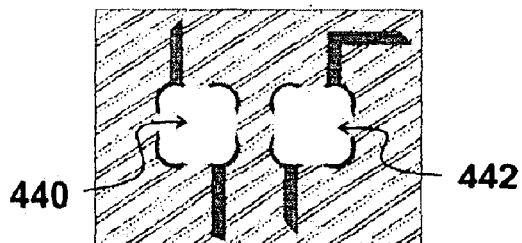

FIG. 4F illustrates a first via 440 that is formed by drilling into substrate 402 to combine the first cluster of holes 412. Likewise, a second via 442 is formed by combining the second cluster of holes 414. Each of the vias 440, 442 may be formed by drilling into the substrate 402 in the center of the respective cluster of holes 412, 414. The drilling performed in this step may also reduce the metal on the substrate's surface adjacent to the vias 440, 442. The tool used in this step to create the first and second vias 440, 442 is sufficiently large to remove the material bridging hole clusters 412 and 414. The result is that each via 440, 442 has an irregular shape, with rounded corners. In an embodiment such as shown, each corner may have a distinct radius of curvature provided by the smaller tool used to create the individual holes in clusters 412 and 414. In addition, an edge surface of the vias 440, 442 corresponding to areas on the substrate 402 between individual holes in the clusters 412, 414 have radius of curvatures provided by the larger tool. Though not illustrated, hole clusters can be created using drills of varying sizes if desired.

Figure 4H:
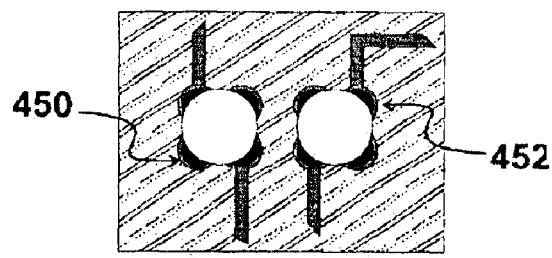
FIG. 4H illustrates the surface of a substrate after performance of a method such as described in FIGS. 4A–4F, with the optional step described with FIG. 4G.

As an alternative step, FIG. 4G illustrates an optional step that can be performed before the step illustrated by FIG. 4F, where the holes of each cluster are filled with solder or highly conductive paste. Subsequently, the step described with step 4F is performed to yield a result shown by view of FIG. 4H. As comparison, the interior of the via shown in FIG. 4H is more circular than the interior of the via shown by FIG. 4F. As shown, pedals 450, 452 may be formed to abut each of via 440 and 442. In addition, the hole walls having more metal on the surface are generally more robust.

Connector Application

Figure 5:
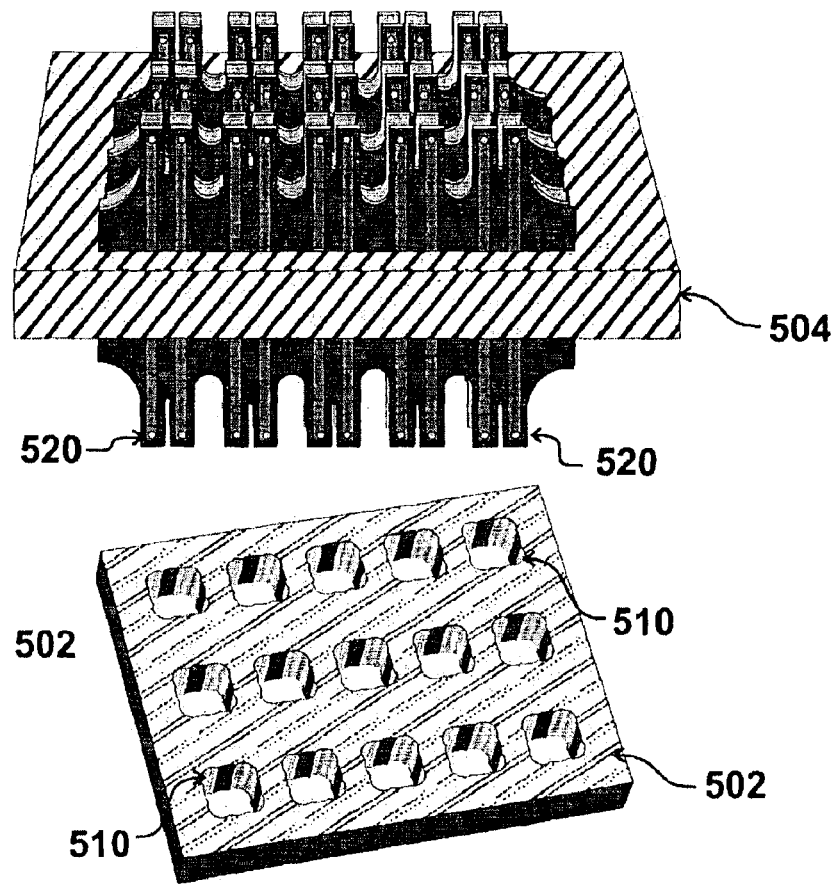
FIG. 5 illustrates a connector formed according to an embodiment of the invention.

Various applications exist for embodiments such as described in FIGS. 1–3. FIG. 5 illustrates one application where a female connector is formed by a substrate 502 containing vias 510 such as formed and described previously. Specifically, each via 510 contains one or more trace elements which can contact male elements inserted into that via. For example, as shown by FIG. 5, an array of male elements 520 provided on a second substrate 504 can mate with vias 510 to interconnect circuitry on the first substrate 502 with circuitry on the second substrate 504.

Figure 6:
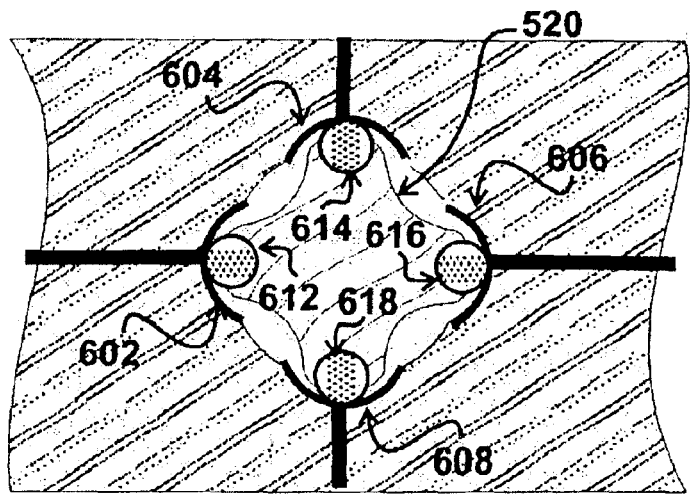
FIG. 6 illustrates connectivity between a suitable male component and a female connector element such as described in FIG. 5.

The male elements 520 may each be shaped to fit within a corresponding via 510 on substrate 502. FIG. 6 illustrates an example of how a given one of the male element 520 can fit into a given one of the vias 510 on substrate 502. In the example shown, the male member 520 may be star-shaped to fit within the via 510. The via 510 may include four trace elements 602, 604, 606, and 608. These trace elements make contact with corresponding contact elements 612, 614, 616 and 618 of the male element 520. While a connector with four elements has been described, more or less elements can be used.

As shown by FIGS. 5 and 6, embodiments of the invention can be employed to create an integral high-density or high-performance female connector receptacle with two or more discrete connections within a single via. Such connections may provide excellent signal integrity of both differential signal pairs and controlled impedance transmission line type connections, so as to greatly reduce the reflections that are common with connectors. A high-density male connector for interconnecting to a circuit board with multipath vias, such as illustrated in FIG. 5, may be formed by bonding a flex circuit to an etched spring metal having bifurcations for contact sets and contact pairs. Springs can provide the male members described above by being twisted into angle necessary for making contact with trace elements within the via 510. This angle may correspond to 45 degrees. The contacts on the flex circuit can have bumps to increase the normal force and prevent slippage from the connector channel. The spring metal may serve as both electromagnetic interference shield and to control characteristic impedance.

An embodiment such as shown in FIGS. 5 and 6 may also provide a mechanism where substrates with circuitry and other current-carrying elements can be selectively stacked onto one another to form an integrated assembly. Such an embodiment may enable multilayered circuit devices to be formed with high-density circuitry and array interconnectivity, while the overall design and functionality of the assembly is robust and selectable.

In one application, multiple sets of male and female connectors can be molded together to create a mezzanine connector between parallel boards having the high density female connector receptacle construction. Flex connectors on spring metal can also be bent 90 degrees to allow orthogonal interconnection to another board or boards.

Backplane Application

In general, the performance of conventional backplanes is limited by the presence of "stubs", which are small circuit remnants in vias, and by signal degradation effects brought about by the presence of circular plated vias. These factors may cause inductance, degrade high-speed signal performance, cause signal reflections, and "ringing". In contrast, embodiments of the invention may employ vias for use in backplanes which lessen or avoid the signal degradation affects of more traditional backplanes.

Figure 7:
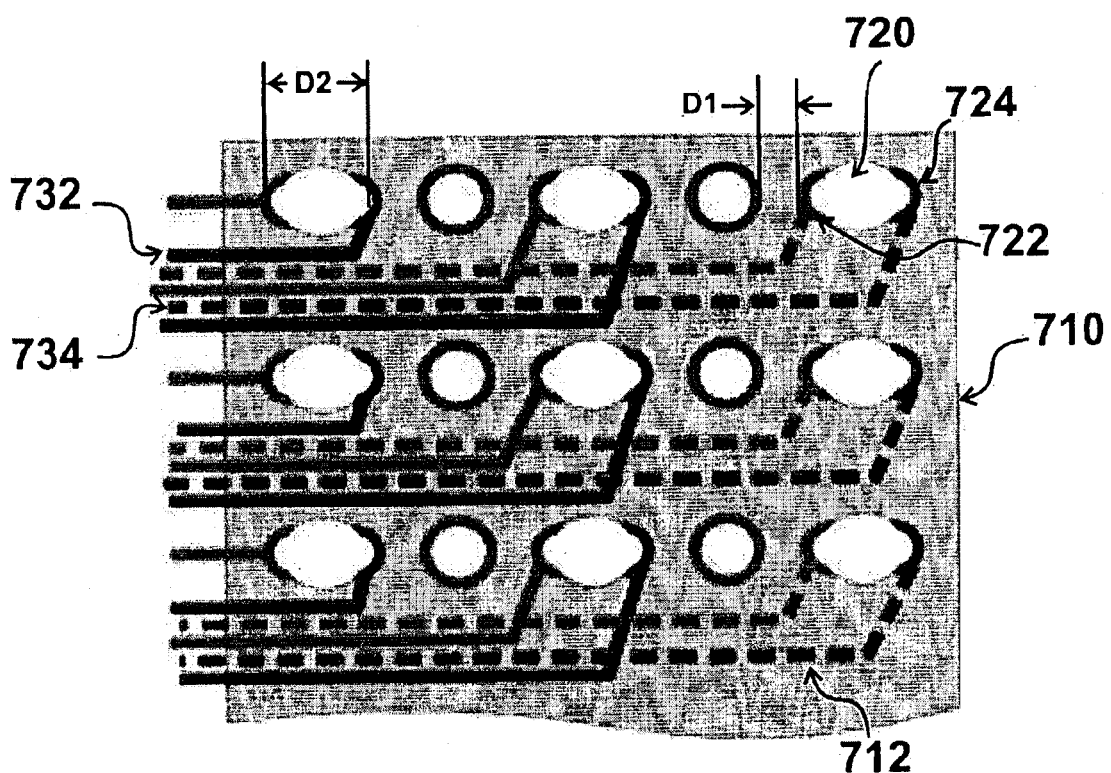
FIG. 7 illustrates a portion of a backplane having an array of vias, according to an embodiment of the invention.

FIG. 7 illustrates a portion of a backplane 710 having an array of vias provided on a surface 712. The vias may be assumed to extend inward into the paper to interconnect the surface 712 to other surfaces (such as the back surface of the substrate forming the backplane). A description of one of the vias 720 is applicable to other vias in the backplane 710. The via 720 may be formed by a process such as described with FIGS. 4A–4G. A first trace element 722 is provided on the surface 712 and extends inward along one side of via 720. A second trace element 724 is provided on the surface 712 and extends inward along another side of via 720. A first signal line 732 extends into the first trace element 722. A second signal line 734 extends into the second trace element 724. As described with other embodiments, the via 720 is irregular in shape, having multiple radius of curvatures. The trace elements 722, 724 are also rounded, but only partially circumferential. While the first trace element 722 and the second trace element 724 may oppose one another across the via 720, the partial circumferential nature of each trace element 722, 724 residing in the same irregularly shaped via enables the distance between the trace elements to be such that signal degradation is minimal. Furthermore, the presence of "stubs" is all but eliminated.

In addition, a backplane embodiment such as shown enables trace elements and signal lines to be more densely placed on the backplane. The spacing D1 between the via 720 and an adjacent via or other openings on the backplane 710 may be set by design specification. But the proximity D2 of two trace elements on opposite sides of a common via 720 may be closer than what is otherwise provided by traditional vias with circumferential trace elements.

High Density Signal Routing

Embodiments of the invention may be employed to facilitate high density signal routing between input/output (I/O) contacts on a substrate, such as provided by a circuit card, cable, or backplane. High density circuit structures can be created using embodiments such as described, as use of such embodiments allow for greater signal routing density.

Figure 8:
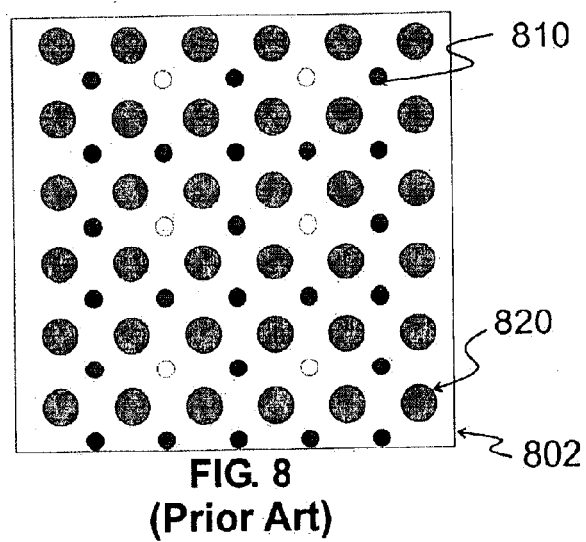
FIG. 8 is a prior art illustration of how traditional vias are distributed on a substrate with input/output contacts.

In high-density circuits, routing between I/O contacts is generally accomplished by distributing contact elements in the form of solder balls or similar elements (such as contact pins) on a board or other array. Traditional design has placed single vias at interstitial locations between sets of four contacts, where each via makes connection to and carries a single electrical or electronic interconnection function (including ground or power). FIG. 8 illustrates a prior-art distribution of traditional vias 810 and I/O contacts 820 on a substrate 802.

Figures 9, 10:
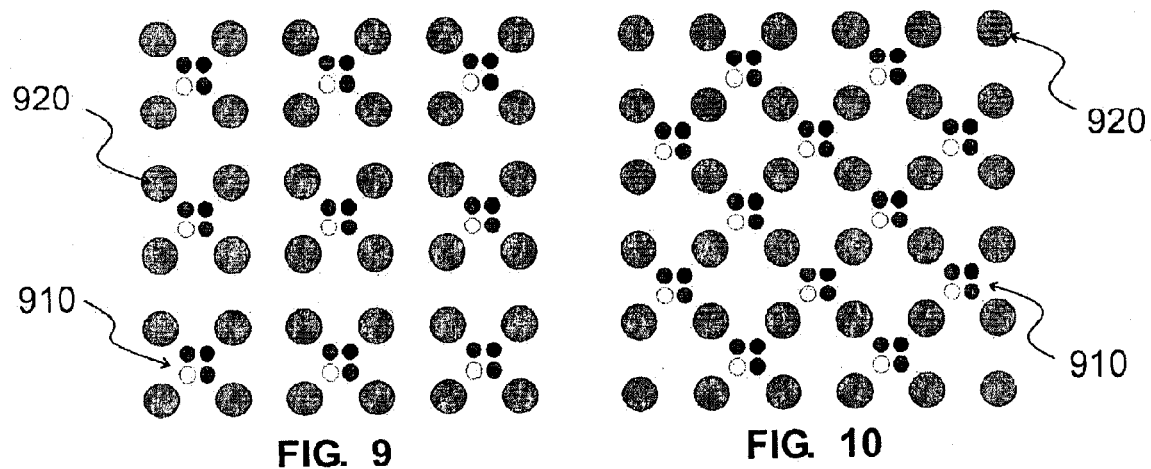
FIG. 9 illustrates one embodiment for distributing vias on a substrate in between input/output contacts so as to create space on the substrate.
FIG. 10 illustrates another embodiment for distributing vias on a substrate in between input/output contacts so as to create space on the substrate.

FIGS. 9 and 10 illustrate via placement according to different embodiments of the invention. While in FIG. 8, one via designated as ground, power, or signal, is placed in between sets of four I/O contacts, FIGS. 9 and 10 illustrate sets 910 of smaller vias that are distributed between four I/O contacts 920. The sets of smaller vias may include four vias, where one vias is for interconnecting a surface of the substrate to a ground, another is for interconnecting the surface of the substrate to power, and yet another is to interconnect the surface of the substrate to other circuitry. The uses of the vias can be changed to meet the needs and requirements of the individual circuit. FIGS. 9 and 10 illustrate different placements of the sets 910 of vias. In each placement, channels are freed between I/O contacts 920 for running circuitry, such as escape lines. The vias 910 in FIGS. 9 and 10 are smaller closer than traditional vias but can be advantageously drilled out to increase spacing between them as needed while retaining the partially circumferential connections, such as described in previous embodiments.

Providing sufficient number of escape lines and other circuitry has been a challenge with past integrated circuit package designs. For example, escape lines typically bypass groups of vias on the surface having the I/O contacts that are used to make interconnection to the next level interconnection device or substrate. The result is a significant waste or signal routing opportunity. Because a single via may be distributed between sets of four I/O contacts, insufficient channel space exists in high-density applications to run escape lines on one side of the substrate surface. In the past, escape lines required for a particular substrate were commonly provided either all on the back side of the substrate if possible or through additional layers of circuitry in the package substrate adding to the expense of the device package. Increasing the routing capability without increasing layer count is thus highly desirable. The present invention provides such advantage. An example of this traditional approach is shown by FIGS. 11 and 12. FIG. 11 shows a front side 1002 of a substrate 1010, with I/O contacts 1014 and corresponding vias 1015. Because a single via 1015 is disposed between four I/O contacts 1014, insufficient room remains to channel escape lines on the substrate. Thus, as shown by FIG. 12, a back side 1022 of the substrate retains all of the escape lines 1018 of the substrate. Furthermore, all of the escape lines 1018 are run over the segments of the substrate opposing the I/O contacts 1110 on the front side 1012.

FIGS. 13 and 14 illustrates substrates equipped with vias such as provided by embodiments herein, so that a greater number of escape lines and other circuitry can be carried on the substrate surfaces. FIGS. 13 and 14 are design using common design rules for signal traces, spaces between traces, vias, holes and pads with those ues in FIGS. 11 and 12 to illustrate the advantages of the improved method when compared with traditional methods. Specifically, a FIG. 13 illustrates a front side 1102 of a substrate 1110 with I/O contacts 1114 and corresponding sets of vias 1115. In an embodiment such as shown, sets of four vias are disposed between four I/O contacts 1114. The result is that significant space on the substrate 1110 is freed up for circuit routing. As such, channels can be provided on the front side 1102 for running escape lines 1118. On the back side 1104, even more escape lines 1118 and other circuitry can be provided because a greater distance between linear sets of I/O contacts 1115 exist.

Embodiments such as described in FIGS. 13 and 14 offer a 30%–50% increase in circuit routes between traces. Thus, for example, circuit assemblies that would normally require 6 to 8 layers to complete with designs described in FIGS. 11 and 12 could be effectively routed with as few as four layers with embodiments such as described in FIGS. 13 and 14.

Figure 15:
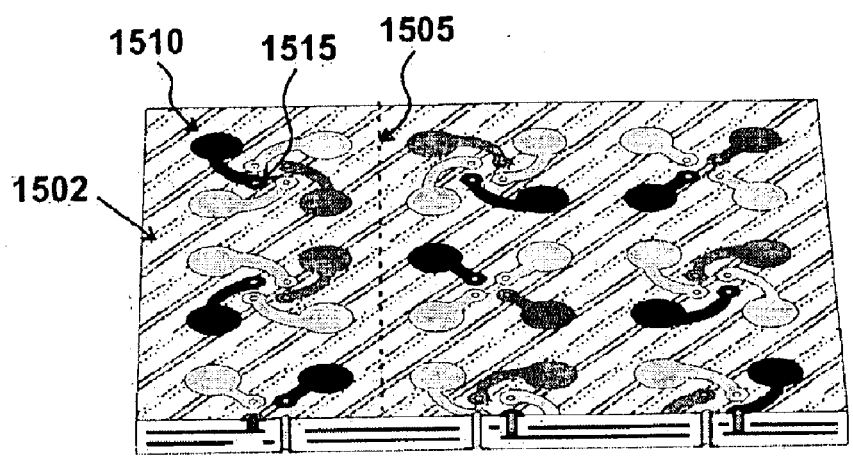
FIG. 15 is a front isometric view of a substrate with vias and input/output contacts positioned to create channels for escape lines and other circuitry, according to an embodiment of the invention.

FIG. 15 is a front isometric view of a substrate design using vias as described with embodiments of the invention. A substrate 1502 may carry I/O contacts 1510 and vias 1515. The via 1515 may employ partial circumferential trace elements, enabling the vias 1515 to be placed more proximate to I/O contacts 1510 than more traditional designs. Furthermore, the relatively smaller vias 1515 may be more readily positioned relative to the I/O contacts 1510 so that channels 1505 form on the substrate 1502. The channel 1505 may provide spacing where circuit elements (such as escape lines) may be extended. The use of blind vias to connect to internal ground and power layers can also be used to advantage to increase routing channels when desired.

Figure 16:
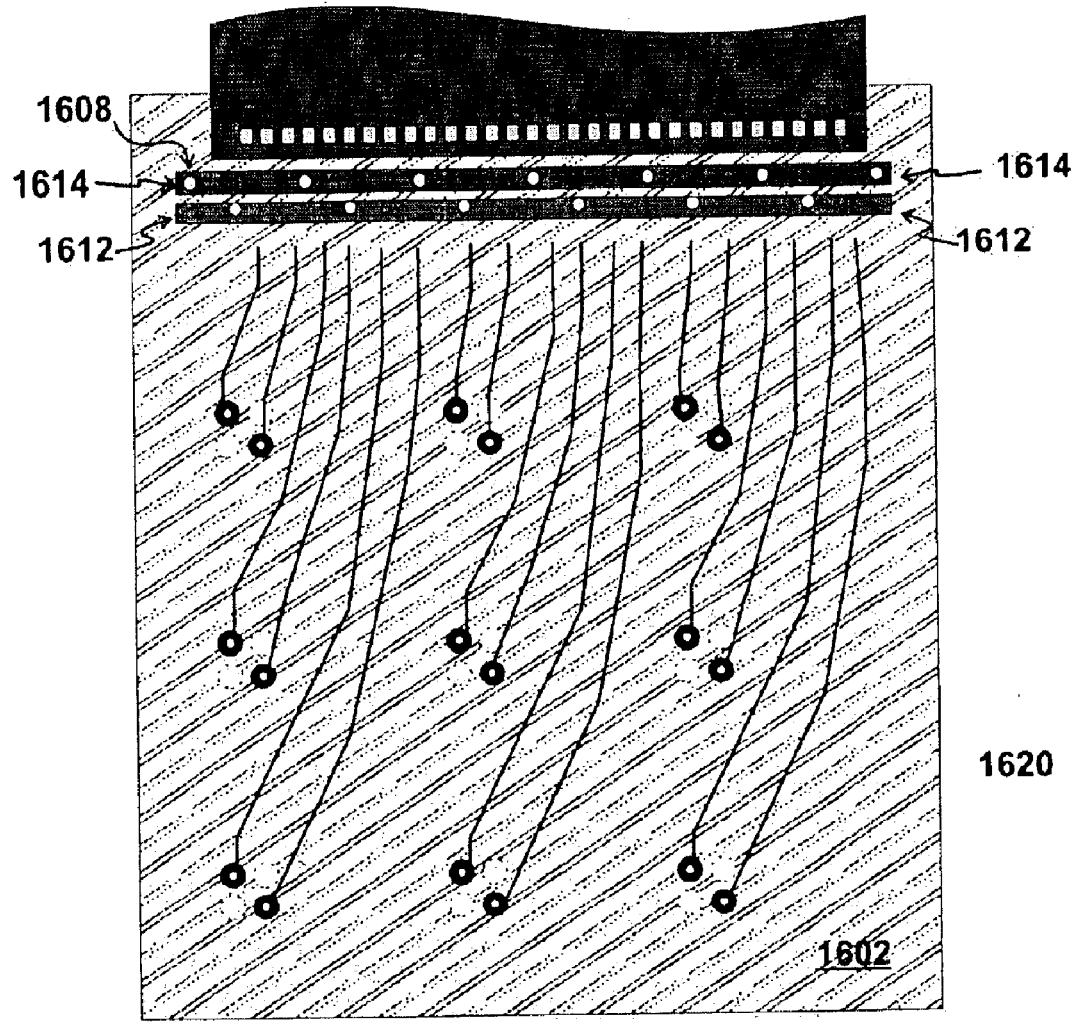
FIG. 16 is a top view of a chip-package substrate that employs vias as described by embodiments of the invention, except that the substrate also incorporates the use of "blind" vias to further reduce the number of trace elements that extend on its surface.

FIG. 16 is a top view of a chip packaging substrate 1602 that employs vias as described by embodiments of the invention, except that the substrate also incorporates the use of "blind" vias to further reduce the number of trace elements that extend on its surface. An integrated circuit (IC) chip or device may be attached or otherwise mounted to the substrate 1602. The blind vias are holes that extend only partially into the substrate. In one embodiment, a set of blind vias 1612 are used to connect to a ground plane (not shown), and another set of vias 1614 are used to connect to a power plane (not shown), on one peripheral end 1608 of the substrate 1602. Signal lines may extend across the substrate's surface to vias constructed with trace elements, such as described in previous embodiments.

While certain aspects of the invention are presented below in certain claim forms, the inventors contemplates the various aspects of the invention in any number of claim forms. Accordingly, the inventors reserve the right to add additional claims after filing the application to pursue such additional claim forms for other aspects of the invention.

What we claim is:

1. A multilayered circuit component comprising:
   two or more layers;
   a first surface of the two or more layers upon which a first plurality of circuit paths are provided;
   a second surface of the two or more layers upon which a second plurality of circuit paths are provided;
   an aperture extending through at least a portion of the two or more layers, the aperture being defined by a first opening on the first surface, a second opening on the second surface, and internal surfaces of the two or more layers that extend between the first surface and the second surface;
   a first trace element provided over a portion of one of the internal surfaces of the aperture to extend between the first surface and the second surface, the first trace element extending onto the first surface to form a first partial perimeter of the first opening;
   wherein the first trace element is formed by plating a first hole through the first surface, and then subsequently forming the aperture to intersect the first hole, so that after the aperture is formed, a remaining portion of the first hole has plating that forms the first trace element;
   a second trace element provided over a portion of one of the internal surfaces of the aperture to extend between the first surface and the second surface, the second trace element extending onto the first surface to form a second partial perimeter of the first opening; and
   wherein the first trace element and the second trace element are formed by plating the first hole and a second hole on the first surface, and then subsequently forming the aperture to intersect the first hole and the second hole, so that after the aperture is formed, the remaining portion of the first hole has plating that forms the first trace element, and a remaining portion of the second hole has plating that forms the second trace element, and wherein the first trace element and the second trace element each form a pedal shaped support element on the first surface.

2. The component of claim 1, wherein at least one of the internal surfaces is a grounding plane.

3. The component of claim 1, wherein at least one of the internal surfaces is a power plane.

4. The component of claim 1, wherein each of the first trace element and the second trace element is rounded as it extends on one of the internal surfaces of the aperture.

5. The component of claim 1, wherein the aperture has an irregular cross-section, and wherein each of the first trace element and the second trace element is rounded as it extends on one of the internal surface of the aperture.

6. The component of claim 1, wherein the component forms part of a backplane.

7. The component of claim 1, wherein the first trace element has a radius of curvature that defines a corresponding circle, and wherein the first trace element has an arc length that is less than 50% of a circumference of the corresponding circle.

8. The component of claim 1, wherein the arc length of the first trace element is less than 33% of the circumference of the corresponding circle.

9. The component of claim 1, wherein the aperture has an irregular cross-sectional shape.

10. The component of claim 1, wherein a cross-section of the aperture is shaped to have a plurality of different radii of curvatures.

11. A multilayered circuit component comprising:
    two or more layers;
    a first surface of the two or more layers upon which a first plurality of circuit paths are provided;
    a second surface of the two or more layers upon which a second plurality of circuit paths are provided;
    an aperture extending through at least a portion of the two or more layers, the aperture being defined by a first opening on the first surface extending through to the second surface, a second opening on the second surface, and internal surfaces of the two or more layers that extends between the first surface and the second surface;
    a first trace element provided over a portion of one of the internal surfaces of the aperture to extend between the first surface and the second surface, the first trace element extending onto the first surface to form a first partial perimeter of the first opening;
    wherein the first trace element is formed by plating a first hole on the first surface, and then subsequently forming the aperture to intersect the first hole, so that after the aperture is formed, a remaining portion of the first hole has plating that forms the first trace element, and wherein the first trace element has a radius of curvature that defines a first circle, the second trace element has a radius of curvature that defines a second circle, and wherein the first trace element and the second trace element each have an arc length that is less than 50% of a circumference of the corresponding first or second circle;
    a second trace element provided over a portion of the one of internal surfaces of the aperture to extend between the first surface and the second surface, the second trace element extending onto the first surface to form a second partial perimeter of the first opening; and
    wherein the first trace element and the second trace element are formed by plating the first hole and a second hole on the first surface extending through to the second surface, and then subsequently forming the aperture to intersect the first hole and the second hole, so that after the aperture is formed, the remaining portion of the first hole has plating that forms the first trace element, and a remaining portion of the second hole has plating that forms the second trace element.

12. A multilayered circuit component comprising:

two or more layers;

a first surface of a first layer in the two or more layers, the first surface containing one or more circuit elements;

an array of apertures extending through at least a portion of the first layer to extend between the first surface and at least one other surface of the two or more layers, each aperture in the array having a first opening on the first surface;

one or more discrete trace elements provided over an interior surface of each aperture in the array, each trace element extending between the first surface and the at least one other surface of the two or more layers, and each trace element forming a portion of a cross-sectional perimeter of the aperture which contains that trace element;

wherein each aperture is shaped to receive a corresponding male connector element that can extend into the aperture and make electrical contact with the one or more trace elements that are provided in that aperture, so that another layer comprising an array of male connectors is matable with the component using the array of apertures of the first surface.

13. The component of claim 12, wherein one or more of the apertures in the array contain one or more trace elements that extend from the respective apertures and form a corresponding pedal shaped support element on the first surface.

14. The component of claim 12, wherein one or more of the apertures in the array contain one or more trace elements that are rounded as they extend into the respective aperture.

15. A multilayered circuit component comprising:

two or more layers;

a first surface of the two or more layers upon which a first plurality of circuit paths are provided;

a second surface of the two or more layers upon which a second plurality of circuit paths are provided;

an aperture extending through at least a portion of the two or more layers, the aperture being defined by a first opening on the first surface, a second opening on the second surface, and internal surfaces of the two or more layers that extends between the first surface and the second surface;

a first trace element provided over a first portion of one of the internal surfaces of the aperture to extend between the first surface and the second surface, the first trace element being rounded and extending onto the first surface to form a first partial perimeter of the first opening, wherein the first partial perimeter of the first opening has a first radius of curvature, the second partial perimeter of the first opening has a second radius of curvature, and another perimeter portion of the opening has a third radius of curvature, wherein at least the third radius of curvature is different than the first radius of curvature and the second radius of curvature;

a second trace element provided over a second portion of one of the internal surfaces of the aperture to extend between the first surface and the second surface, the second trace element being rounded and extending onto the second surface to form a second partial perimeter of the first opening;

wherein the opening of the aperture has a plurality of radii of curvatures.

16. A multilayered circuit component comprising:

an array of input/output contact points provided on a first surface of the first layer of the circuit component;

a plurality of trace element clusters, each trace element cluster extending inward from the first surface of the first layer to an other surface of the multi-surfaced circuit component, wherein each trace element cluster includes at least (i) a first trace element for providing a first connection to one or more current bearing components on the other surface that the first trace element extends to, and (ii) a second trace element for providing a second connection to one or more current bearing components on the other surface that the second trace element extends to; and wherein at least some of the trace element clusters are positioned interstitially between two or more input/output contact points in the array.

17. The component of claim 16, wherein at least some of the trace element clusters are positioned interstitially between a set of four input/output contact points in the array.

18. The component of claim 16, wherein at least one trace element cluster provides that the first trace element contacts a ground or power plane.

19. The component of claim 16, wherein at least some of the trace element clusters include four or more trace elements, wherein each of the four or more trace elements makes a distinct connection with a current bearing component on another surface.

20. The component of claim 16, wherein the interstitially positioned trace element clusters are disposed within the array so that one or more channels for extending escape lines are formed.

\* \* \* \* \*